United States Patent
Nishiguchi et al.

[11] Patent Number: 5,212,880
[45] Date of Patent: May 25, 1993

[54] APPARATUS FOR PACKAGING A SEMICONDUCTOR DEVICE

[75] Inventors: Masanori Nishiguchi; Atsushi Miki, both of Yokohama, Japan

[73] Assignee: Sumitomo Electric Industries, Osaka, Japan

[21] Appl. No.: 717,015

[22] Filed: Jun. 18, 1991

[30] Foreign Application Priority Data
Jun. 19, 1990 [JP] Japan ................... 2-160346
Jul. 6, 1990 [JP] Japan ................... 2-178721

[51] Int. Cl.⁵ ............ B23P 19/04; B23K 37/04; H01L 21/60
[52] U.S. Cl. .................... 29/739; 29/721; 29/743; 29/833; 228/105
[58] Field of Search ........... 29/720, 721, 743, 833, 29/760, 840, 739; 156/379; 228/4.5, 105

[56] References Cited

U.S. PATENT DOCUMENTS

| | | |
|---|---|---|
| 3,735,911 | 5/1973 | Ward .................... 228/19 |
| 3,923,584 | 12/1975 | Hojo et al. .............. 156/379 |
| 4,671,446 | 6/1987 | Sherman ............... 228/105 X |
| 4,677,473 | 6/1987 | Okamoto et al. ....... 228/105 X |
| 4,896,206 | 1/1990 | Denham . |
| 4,899,921 | 2/1990 | Bendat et al. .......... 228/105 |

OTHER PUBLICATIONS

"Interference of Light Waves", p. 791 of Physics for Scientists and Engineers, Raymond Serway, CBS College Publishing, 1982.

Primary Examiner—Mark Rosenbaum
Assistant Examiner—Peter Dungba Vo
Attorney, Agent, or Firm—Cushman, Darby & Cushman

[57] ABSTRACT

This invention is directed to an apparatus for packaging a semiconductor flip chip on a substrate by face-down bonding in which coherent light is used to irradiate a bonding head and the substrate, and the light reflected by the bonding head and the substrate form interference patterns. Adjustment of the inclination of the bonding head against the substrate is performed by observation of the interference fringes caused by the interference between the light reflected by the bonding head and the light reflected by the substrate.

5 Claims, 4 Drawing Sheets

APPARATUS FOR PACKAGING A SEMICONDUCTOR DEVICE

BACKGROUND OF THE INVENTION

1. Field of the Invention

The present invention relates to a method and apparatus for packaging a semiconductor device, and more particularly to a method and apparatus for packaging a semiconductor device to a substrate by face-down bonding.

2. Related Background Art

A flip chip packaging technique in face-down bonding has recently been attracting interest in view of a packaging density and workability in packaging increased semiconductor device onto a substrate. This method is described in an article entitled "Technology Trend of Flip Chip Packaging, Electronic Packaging Technology, December 1989. When a flip chip is to be packaged onto the substrate by the face-down method, it is bonded while it is kept parallel to a plane of the substrate to which the semiconductor device is packaged. In the prior art, however, the face-down bonding is carried out without adjustment after an initial adjustment of the packaging apparatus to adjust a parallelism between a bonding head and the plane of the substrate. Thus, in this method, the semiconductor device may not be bonded to the plane of the substrate without failure. To solve this problem, the semiconductor device is observed by a TV camera mounted beside a bonding head which sucks and holds the semiconductor device during the face-down bonding process to watch the parallelism between the bonding head and the substrate.

In the prior art method described above, the parallelism of only several μm/10 mm is attained between the semiconductor device having the bump formed thereon and the substrate to which the semiconductor device is to be bonded. Accordingly, it cannot comply with high density packaging which requires that a bump height of the flip chip is smaller than 10 μm.

SUMMARY OF THE INVENTION

The present invention intends to solve the above problem and provide a semiconductor device packaging apparatus which can comply with the high density packaging.

It is an object of the present invention to provide an apparatus for packaging a semiconductor device comprising: bonding head having a holding plane adapted to hold a semiconductor device having a bump electrode formed on a front surface thereof by sucking a rear surface thereof and a light reflective plane formed around the holding plane; a stage opposed to said holding plane adapted to hold a substrate on which the semiconductor device is to be face-down bonded; irradiation means for irradiating a coherent light to the light reflective plane and said stage; observing means for causing a light reflected by the light reflective plane to interfere with a light reflected by the substrate held by said stage of the light irradiated by said irradiating means to observe an interference state therebetween to detect the inclination between the semiconductor chip against the substrate; and adjusting means for moving the bonding head against said stage to adjust parallelism between the plane on which the bump electrode of the sucked semiconductor device is formed and the plane of the substrate to which the semiconductor device is to be bonded.

It is a further object of the present invention to provide a method for packaging a semiconductor device comprising the steps of: holding a semiconductor device having a bump electrode formed on a front surface thereof by sucking a rear surface thereof to a sucking surface on a bonding head; irradiating a coherent light to a light reflective plane of the bonding head formed around the sucking surface and a light reflective substrate to which the semiconductor device is to be bonded and held on a stage disposed facing to the bonding head; interfering a light reflected by the substrate and a light reflected by the light reflective light plane of the light irradiated in said irradiative step to detect an interference fringe; moving the bonding head in accordance with a state of the interference fringe detected in said detection step; adjusting a parallelism between the plane on which the bump electrode of the sucked semiconductor device is formed and the plane of the substrate to which the semiconductor device is to be bonded; and face-down bonding the semiconductor device to the substrate.

Concretely, in the method and apparatus for packaging the semiconductor device in a light transmissive substrate, the coherent light is irradiated from the back side of the substrate. The light reflected by the light reflection plane on the bonding head is interfered with the light reflected by the back side of the substrate so that the parallelism between the surface of the semiconductor device and the plane of the substrate is exactly detected. The bonding head is moved in accordance with the detection output so that the parallelism between the surface of the semiconductor device and the plane of the substrate is maintained.

Concretely, in the method and apparatus for packaging the semiconductor device in a light reflective substrate, the coherent light is irradiated from the front side of the substrate. The light reflected by the light reflection plane on the bonding head interferes with the light reflected by the front side of the substrate and is reflected by the light reflection plane so that the parallelism between the surface of the semiconductor device and the plane of the substrate is exactly detected. The bonding head is moved in accordance with the detection output so that the parallelism between the surface of the semiconductor device and the plane of the substrate is maintained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
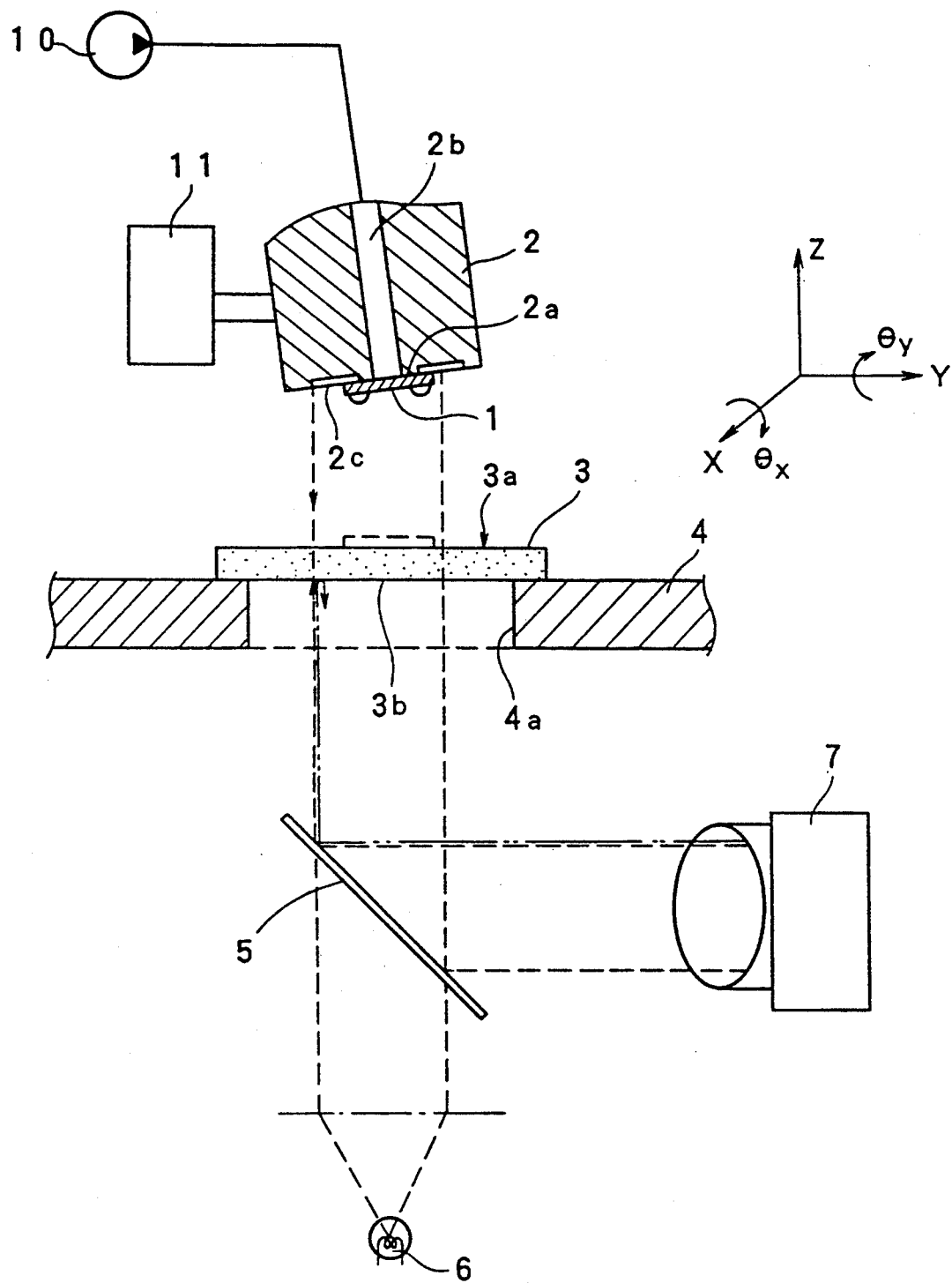
FIG. 1 shows a semiconductor device packaging apparatus of a first embodiment according to the present invention.

FIG. 1 shows a semiconductor device packaging apparatus of a first embodiment according to the present invention, and is used for packaging a semiconductor device in a light transmission substrate.

As shown in FIG. 1, the semiconductor device packaging apparatus has a bonding head 2 which has a plane 2a(sucking plane) for sucking and securing a semiconductor device 1, formed at an end thereof. A through-hole 2b connected to a vacuum pump 10 is formed at a center of the plane 2a. A mirror plane 2c (light reflection plane) which is parallel to a bump electrode plane of the semiconductor device (which is to be vacuum-sucked to the sucking plane) is formed around the sucking plane. The mirror plane 2c may be formed by embedding a member made of a highly light-reflective material around the through-hole 2b and polishing it. A position adjusting unit 11 is mechanically connected to the bonding head 2. The bonding head 2 is movable along a Z direction which is perpendicular to an X-Y plane which corresponds to a semiconductor mount plane 3a of the light-transmissive substrate 3 mounted on the packaging apparatus, and is also adjustable to a X axis and an Y axis which are parallel to the X-Y plane and define a plane which passes through a center of the through-hole 2b on the plane 2a, toward rotation angles $\theta_x$ and $\theta_y$, respectively, by the position adjusting unit 11.

A substrate holder 4 of the semiconductor device packaging apparatus has a through-hole 4a so that it can support the substrate 3 at the periphery thereof and permit the irradiation of the light from the bottom side of the substrate 3. The size of the through-hole 4a is preferably larger than the area of the mirror plane 2c formed on the bonding head 2. The substrate holder 4 further has a securing mechanism (not shown) for securing the light transmissive substrate 3 mounted thereon.

A half-mirror 5 is arranged below the through-hole 4a of the substrate holder 4. The half-mirror 5 is fixed at an angle of inclination of 45 degrees to the back side 3b of the light transmissive substrate 3 which is secured to the substrate holder 4. A light source 6 such as a laser beam generator which irradiates a coherent and collimated light perpendicular to the rear surface side 3b of the secured light transmissive substrate 3 is arranged below the half-mirror 5.

A monitor 7 such as a microscope for observing an interference state of the light, more specifically an interference fringe, is arranged beside the half-mirror 5. The microscope 7 is positioned on a line extending from the inclined plane of the half-mirror 5 perpendicular to the direction of propagation of the collimated light emitted from the light source 6. With this arrangement, the interference status between the collimated light emitted from the light source 6 and reflected by the rear surface 3b of the substrate 3 and the light reflected by the mirror plane 2c of the bonding head 2 can be observed.

A method for face-down bonding the semiconductor device 1 to the semiconductor device mount plane 3a on the substrate 3 by using the above apparatus is now explained.

First, the substrate 3 is secured to a predetermined position to cover the through-hole 4a of the substrate holder 4. Then, the semiconductor device 1 is displaced such that the plane opposite to the bump electrode plane covers the through-hole 2b of the bonding head 2, and the semiconductor device 1 is vacuum-sucked by the vacuum pump 10 through the through-hole 2b so that it is sucked and held to the end of the bonding head 2.

Figure 4D:
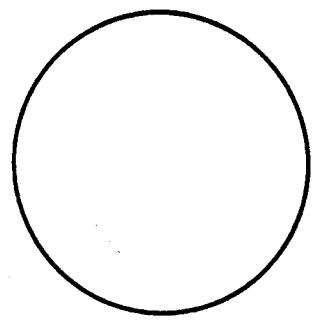
Figure 4C:
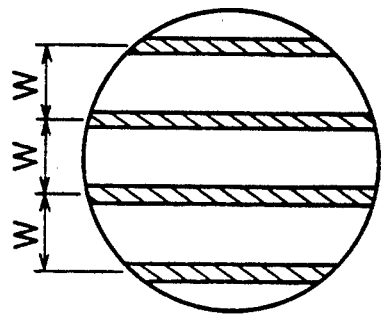

Then, the light source 6 is energized to irradiate the laser beam to the rear side of the substrate 3 through the half-mirror 5. The interference state between the light reflected by the rear surface 3b of the substrate 3 and the light reflected by the mirror plane 2c of the bonding head 2 is observed by the microscope 7. If the mirror plane 2c of the bonding head 2 is substantially inclined with respect to the semiconductor device mount plane 3a of the substrate 3, there are too many interference fringes to observe, as shown in FIG. 4(a) using the position adjusting unit 11.

Figure 4B:
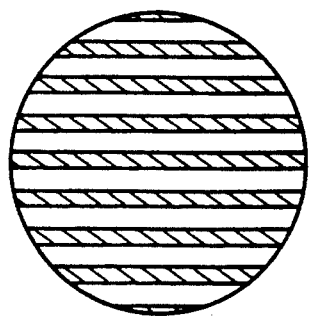
Figure 4A:
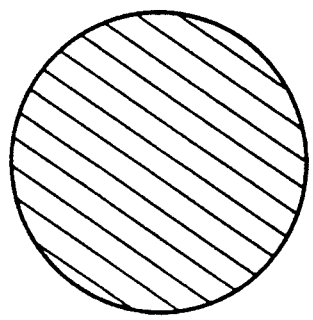

In this case, the rotation angle $\theta_x$ along the X axis and the rotation angle $\theta_y$ along the Y axis of the bonding head 2 are adjusted to enable the observation of the interference fringes, as shown in FIG. 4(b).

Then, as shown in FIG. 4(c), the rotation angle $\theta_x$ along the X axis and the rotation angle $\theta_y$ along the Y axis of the bonding head 2 are finely adjusted to expand an interval W of the observed interference fringes. The smaller the angle of inclination of the bonding head 2 with respect to the semiconductor device mount plane 3a of the substrate 3, the larger is the interval of the interference fringes, and when they are perfectly parallel, the interference fringe is not observed. When the interference fringe disappears form a field of view of the microscope 7, the adjustment of the angles of the bonding head 2 is stopped and the bonding head 2 is moved in the −Z direction (descending direction) to effect the face-down bonding. For example, where the observation area is 10 mm on the mirror plane 2c of the bonding head 2 and a He-Ne laser beam having a wavelength of 0.63 $\mu$m is used as the coherent light, an interference fringe appears at every optical path difference of 0.63 $\mu$m. Accordingly, the parallelism between the mirror plane 2c of the bonding head 2 and the semiconductor device mount plan 3a of the substrate 3 is smaller than 0.3 $\mu$m at the distance of 10 mm when the interference fringe is not observed as shown in FIG. 4(d).

In this manner, the parallelism between the plane on which the bump electrode of the semiconductor device 1 is formed and the semiconductor device mount plane 3a of the substrate can be simply and precisely detected, and the inclination of the bonding head 2 is adjusted in accordance with the detection output so that highly accurate face-down bonding is attained.

Figure 2:
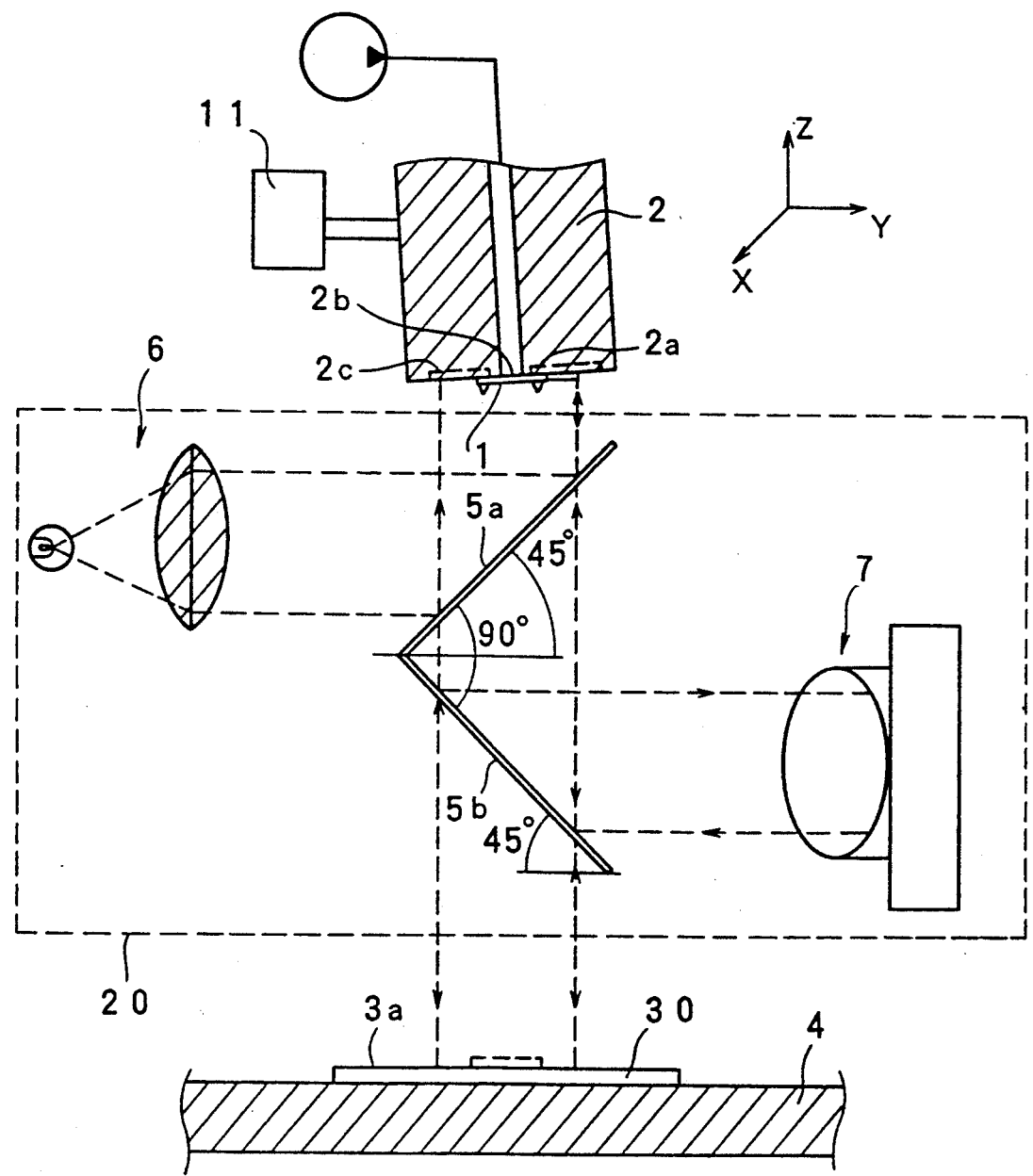
FIG. 2 shown a semiconductor device packaging apparatus of a second embodiment according to the present invention.

FIG. 2 shows a semiconductor device packaging apparatus of a second embodiment according to the present invention used for packaging a semiconductor device in a light substrate.

As shown in FIG. 2, the semiconductor device packaging apparatus has a bonding head 2 which has a plane 2a(sucking plane) for sucking and securing a semiconductor device 1, formed at an end thereof. A through-hole 2b connected to a vacuum pump 10 is formed at a center of the plane 2a. A mirror plane 2c(light reflection plane) which is parallel to a bump electrode plane of the semiconductor device which is to be vacuum-sucked to the sucking plane is formed around the sucking plane. The mirror plane 2c may be formed by embedding a member made of a highly light-reflective material around the through-hole 2b and polishing it. A position adjusting unit 11 is mechanically connected to the bonding head 2. The bonding head 2 is movable along a Z direction which is perpendicular to an X-Y plane which corresponds to a semiconductor mount plane 3a of a light reflective substrate 30 mounted on the packaging apparatus, and also is adjustable to an X axis and a Y axis which are parallel to the X-Y plane and define a plane which passes through a center of the through-hole 2b on the plane 2a, toward rotation angles $\theta_x$ and $\theta_y$, respectively, by the position adjusting unit 11.

A substrate holder 4 of the semiconductor device packaging apparatus has a planar area to support the entire bottom surface of the substrate 3. The substrate holder 4 further has a securing mechanism (not shown) for securing the light reflective substrate 30 mounted thereon.

Figure 3:
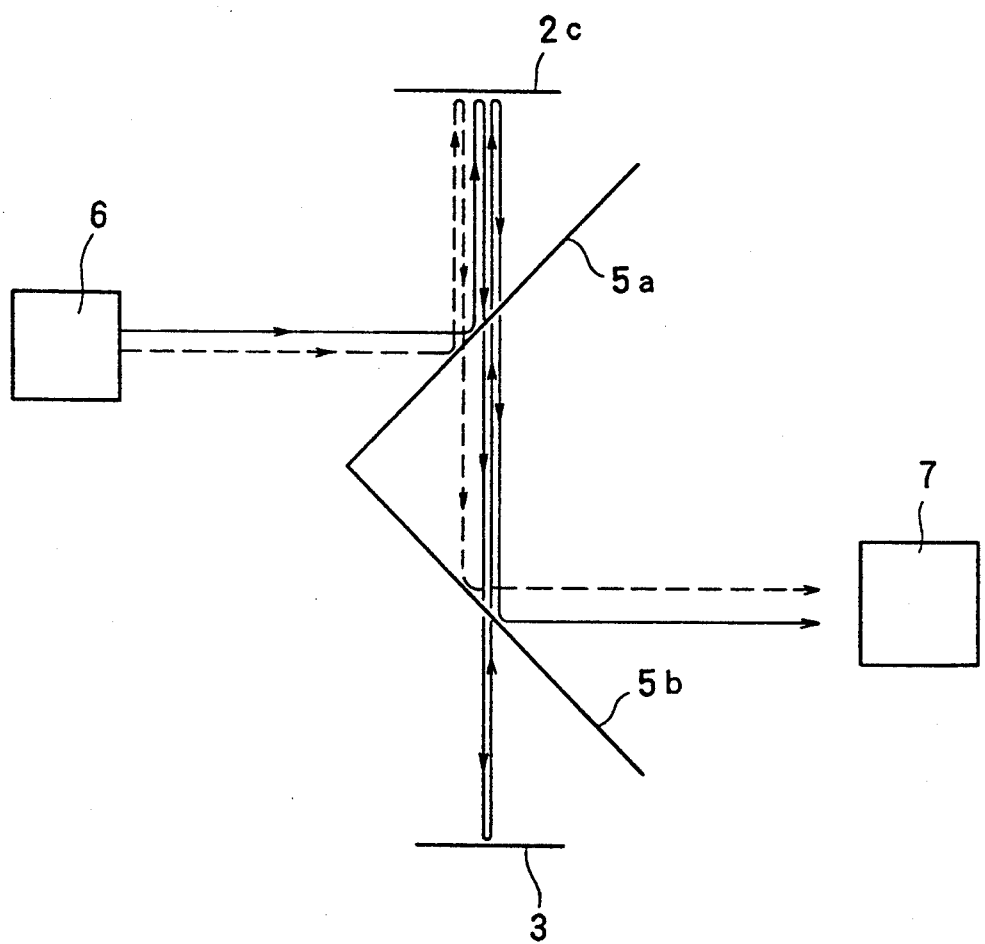
FIG. 3 shows a light path in the semiconductor device packaging apparatus of FIG. 2, and FIGS. 4(a)–(d) show microscope views observed when the semiconductor device is packaged in the embodiments.

Inclination measurement equipment 20 is arranged above the substrate support plane of the substrate holder 4. The inclination measurement equipment is mounted on a manual or automatic drive mechanism (not shown) so that it is movable between a first position which is between the bonding head 2 and the substrate holder 4 and a second position which is beyond the bonding head 2 or the substrate holder 4. It may be moved either by rotation or by parallel movement. The inclination measurement equipment 20 has a pair of half-mirrors 5a and 5b which are arranged to make angles of 45 degrees, respectively, with respect to the substrate support plane of the substrate holder 4 when the inclination measurement equipment 20 is at the first position. The half-mirrors 5a and 5b make an angle of 90 degrees to each other and the respective edges are connected. A light source 6 such as a laser beam generator which emits a coherent and collimated light at an angle of 45 degrees with respect to the plane of the half-mirror 5a is arranged beside the upper half-mirror 5a, a monitor 7 such as a microscope for observing an interference status of the light reflected by the half-mirror 5b, more specifically, an interference fringe is arranged beside the lower half-mirror 5b opposite to the light source 6. The microscope 7 is arranged in a path of the collimated light emitted from the light source 6 to the half-mirror 5a to face the inclined plane of the half-mirror 5b. By this arrangement, an interference state between the collimated light emitted from the light source 6; reflected upward by the half-mirror 5a, reflected by the mirror plane 2c of the bonding head 2 and reflected by the half-mirror 5b toward the microscope 7 and the collimated light emitted from the light source 6, reflected upward by the half-mirror 5a, reflected by the mirror plane 2c of the bonding head 2, transmitted through the half-mirrors 5a and 5b, reflected by the mirror plane 2c and reflected by the mirror plane 2c and reflected by the half-mirror 5b toward the microscope 7, can be observed. The light path thereof is shown in FIG. 3. The interference state between the broken line light and the solid line light shown in FIG. 3 can be observed through the microscope 7. The relative positions of the half-mirrors 5a and 5b, the light source 6 and the microscope 7 are fixed and they are moved integrally.

A method for face-down bonding the semiconductor device 1 onto the semiconductor device mount plane 3a of the light-reflective substrate 30 by using the above apparatus is now explained.

First, the substrate 30 is secured to a position on the substrate holder 4 facing the bonding head 2. Then, the semiconductor device 1 is disposed such that the opposite plane to the plane on which the bump electrode is formed covers the through-hole 2b of the bonding head 2, and the semiconductor device 1 is sucked and secured to the end of the bonding head 2 by the vacuum pump 10 through the through-hole 2b.

Then, the inclination measurement equipment 20 is fixed at the first position between the bonding head 2 and the substrate 30. Then, the light source 6 is energized to irradiate the laser beam to the half-mirror 5a. The interference state between the light reflected by the front surface 3a of the substrate 3 and the light reflected by the mirror plane 2c of the bonding head 2 is observed through the microscope 7. Where the mirror plane 2c of the bonding head 2 substantially inclines with respect to the semiconductor device mount plane 3a of the substrate 3, there are too many interference fringes to permit the observation of the interference fringes, as shown in FIG. 4(a). In this case, the rotation angle $\theta_x$ along the X axis of the bonding head 2 are adjusted to enable the observation of the interference fringes, as shown in FIG. 4(b).

As shown in FIG. 4(c), the rotation angle $\theta_x$ along the X axis and the rotation angle $\theta_y$ along the Y axis of the bonding head 2 are finely adjusted to expand an interval w of the observed interference fringes. The smaller the angle of inclination of the bonding head relative to the semiconductor device mount plane 3a of the substrate 3; the larger the interval of the interference fringes. When perfect parallelism is reached, the interference fringe is no longer observed. When the interference fringe disappears from a field of view of the microscope 7, the angle adjustment of the bonding head 2 is stopped and the angles of the bonding head 2 are fixed. Where the observation area is 10 mm on the mirror plane 2c of the bonding head 2 and a He-Ne laser beam having a wavelength of 0.63 $\mu$m is used as the coherent light, an interference fringe appears at every optical path difference of 0.63 $\mu$m. Accordingly, the parallelism between the mirror plane 2c of the bonding head 2 and the semiconductor device mount plane 3a of the substrate 30 is smaller than 0.3 $\mu$m at the distance of 10 mm when the interference fringe is not observed, as shown in FIG. 4(d).

Then, the inclination measurement equipment 20 is moved to the second position beyond the area between bonding head 2 and the substrate 2. Then, the bonding head 2 is moved in the $-Z$ direction (descending direction) and the face-down bonding is effected.

In this manner, the parallelism between the plane on which the bump electrode of the semiconductor device 1 is formed and the semiconductor device mount plane 3a of the substrate can be simply and precisely detected and the inclination of the bonding head 2 is adjusted in accordance with the detection output so that highly accurate face-down bonding is attained.

The present invention is not limited to the above embodiment, and various modification thereof may be mode.

Specifically, although the laser beam is used as the coherent light in the embodiment, any other coherent light may be used. The laser beam is not limited to the He-Ne laser beam.

While the plane 2a of the bonding head 2 is polished to form the mirror plane 2c in the embodiment, a light reflective member may be bonded instead.

In the method and apparatus for packaging the semiconductor device of the present invention, the parallelism between the semiconductor device and the substrate is detected by using the interference of the lights, as described above. Accordingly, the exact face-down bonding can be attained even for the semiconductor device having a fine bump.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. An apparatus for packaging a semiconductor device comprising:
   a bonding head;
   a holding plane on said bonding head, said holding plane being adapted to hold a semiconductor device by sucking a rear surface thereof;
   a semiconductor device having a bump electrode formed on a front surface thereof, said semiconductor device being held on said holding plane of said bonding head;
   a light reflective plane disposed around the holding plane;
   a stage opposed to said holding plane adapted to hold a substrate on which the semiconductor device is to be bonded in a face-down manner;
   a substrate held on said stage;
   irradiation means for irradiating the light reflective plane and said stage with coherent light;
   observing means for causing light irradiating the light reflective plane and reflected by the light reflective plane to interfere with light irradiating the substrate held by said stage and reflected by the substrate held by said stage to observe an interference state therebetween;
   detection means for detecting an inclination between the semiconductor device and the substrate; and
   adjusting means for adjusting an inclination of said bonding head relative to said stage and for moving the bonding head relative to said stage to adjust said inclination between a plane on which the bump electrode of the semiconductor device is disposed and a plane of the substrate to which the semiconductor device is to be bonded.

2. An apparatus according to claim 1, wherein said irradiation means is disposed on a side of said stage opposite said bonding head and said stage has a through-hole disposed so that said irradiation means irradiates said light reflective plane through said through-hole.

3. An apparatus according to claim 2, wherein said irradiation means comprises:
   a half-mirror inclined at an angle of 45° with respect to said stage; and
   a light source for generating the coherent light; wherein
   said half-mirror and said light source are disposed so that a portion of the coherent light from said light source passes through said half-mirror to said light reflective plane, a portion of the coherent light from said light source passes through said half-mirror to said substrate, light reflected by said light reflective plane and light reflected by said substrate interfere with each other to form an interference pattern, and said half-mirror reflects said interference pattern to said observing means.

4. An apparatus according to claim 1, wherein said irradiation means is disposed on a same side of said bonding head as said stage and is disposed to irradiate the substrate from said side.

5. An apparatus according to claim 4, wherein said irradiation means comprises: two half-mirrors, each of said half-mirrors having reflective planes disposed to have an angle of 90° therebetween; and
   a light source for generating the coherent light; wherein
   said light source and said two half-mirrors are disposed so that a portion of said light from said light source is reflected to said light reflection plane by said half-mirrors, a portion of said light from said light source is reflected to said substrate by said half-mirrors, light irradiating said light reflective plane and reflected by said light reflective plane and light irradiating said substrate and reflected by the substrate interfere with each other to form an interference pattern, and said half-mirrors reflect said interference pattern to said observing means.

* * * * *